(12) United States Patent
Fukuchi et al.

(10) Patent No.: US 9,805,940 B2
(45) Date of Patent: Oct. 31, 2017

(54) PLASMA PROCESSING APPARATUS AND PLASMA PROCESSING METHOD

(71) Applicant: Hitachi High-Technologies Corporation, Tokyo (JP)

(72) Inventors: Kousuke Fukuchi, Tokyo (JP); Shigeru Nakamoto, Tokyo (JP); Tatehito Usui, Tokyo (JP); Satomi Inoue, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/060,822

(22) Filed: Mar. 4, 2016

(65) Prior Publication Data
US 2016/0351405 A1 Dec. 1, 2016

(30) Foreign Application Priority Data

May 25, 2015 (JP) .................................. 2015-105078

(51) Int. Cl.
*G01L 21/30* (2006.01)
*H01L 21/3065* (2006.01)
*H01L 21/308* (2006.01)
*H01J 37/32* (2006.01)

(52) U.S. Cl.
CPC .... *H01L 21/3065* (2013.01); *H01J 37/32009* (2013.01); *H01J 37/32972* (2013.01); *H01L 21/3081* (2013.01); *H01J 2237/334* (2013.01)

(58) Field of Classification Search
USPC .......................................................... 216/60
See application file for complete search history.

(56) References Cited

U.S. PATENT DOCUMENTS

2003/0082919 A1* 5/2003 Pau .......................... H01L 22/26
438/709

FOREIGN PATENT DOCUMENTS

JP 2003-083720 A 3/2003

* cited by examiner

*Primary Examiner* — Roberts Culbert
(74) *Attorney, Agent, or Firm* — Mattingly & Malur, PC (57) ABSTRACT

A plasma processing method includes forming plasma in a processing chamber; and performing etching to a film to be processed of a film structure that has previously been disposed on an upper surface of a wafer that includes a plurality of film layers. The film structure includes: a lower film including at least one film layer and a groove structure; and an upper film including at least one film layer that covers an inside and an upper end of the groove structure. The plasma processing method includes: removing the upper film by etching until an upper end of the groove structure of the lower film is exposed; performing etching to a film layer of the upper film inside the groove structure; and determining an end point by using a value of thickness of the film layer inside the groove structure of the lower film upon completion of the removing.

5 Claims, 5 Drawing Sheets

PLASMA PROCESSING APPARATUS AND PLASMA PROCESSING METHOD

BACKGROUND OF THE INVENTION

1. Field of the Invention

The present invention relates to a plasma processing apparatus or a plasma processing method that performs processing to a sample on a substrate, such as a semiconductor wafer, disposed in a processing chamber inside a vacuum chamber using plasma formed in the processing chamber. More specifically, the invention relates to a plasma processing apparatus or a plasma processing method that detects progress of processing by using light acquired from a film structure during the processing to a film layer to be processed of the film structure including a plurality of film layers previously disposed on a surface of the sample.

2. Description of the Related Art

In the related art, the following technique for the above plasma processing apparatus or plasma processing method, has been known. During processing, such as etching of a film structure to be processed, a film to be processed is etched and then a film layer including a different material disposed on the under the film layer is exposed. As a result, intensity or a change of the intensity of light emission of a predetermined wavelength caused from plasma is detected so as to detect an end point of the processing.

In a case where etching processing is performed to a film to be processed so that the film has desired film thickness or desired depth from a surface, the following technique has been known. Intensity of interference light including a plurality of wavelengths from a surface of a sample or a change with respect to a temporal change of a rate of change of the intensity, is detected from a top of the sample, such as a wafer, during processing. Then, time series data of the interference light including the plurality of wavelengths is compared to database that has been previously acquired so as to detect film thickness or depth of the film to be processed. As the above technique in the related art, for example, a technique disclosed in JP-2003-83720-A has been known.

SUMMARY OF THE INVENTION

However, JP-2003-83720-A has not sufficiently taken the following case in consideration and a problem has occurred.

In recent semiconductor devices, it has been proposed that a wiring structure includes a plurality of predetermined materials included in a plurality of layers laminated and buried inside a groove shape formed on a member, such as silicon, to be a substrate. In order to form the above structure, it is assumed that etching processing is performed to a film layer that has buried the inside of the groove shape of the substrate so that the film layer has desired remaining thickness or depth from an upper end of the groove of the substrate in accordance with a device specification after the film layer is laminated so as to have sufficient thickness on the inside and the upper side of the groove shape of the substrate, for example, after the inside of the groove is buried, and is further covered and laminated up to the upper side.

In the above JP-2003-83720-A, the film structure in which processing is performed to an upper surface of the sample, has a groove structure in which an aspect ratio of, for example, a trench, is relatively large, and a film layer laminated and filled inside the groove. In etching processing to the film layer inside the groove, during the processing, remaining film thickness of the film layer inside the groove (a distance between an upper surface and a lower surface of the film layer or the base of the groove) can be measured. In addition, a distance between the upper surface of the film layer and an upper end of the groove structure, the distance increasing as the film layer is etched so as to be shaved, namely, groove depth can be measured.

However, in the above technique in the related art, in a case where a distance between an upper end and the base of the trench is ununiformed for each wafer before the etching processing is started (initial height of the trench), it is difficult to measure the groove depth of the film layer inside the groove with high precision during the etching. A problem that the etching processing cannot be completed with desired groove depth and a yield of the processing degrades occurs.

An object of the present invention is to provide a plasma processing apparatus or a plasma processing method that is capable of etching a film layer inside a trench with high precision so as to improve a yield.

The above object is achieved by the following plasma processing method. The plasma processing method includes: disposing a wafer to be processed in a processing chamber inside a vacuum chamber; forming plasma in the processing chamber; and performing etching to a film to be processed of a film structure that has previously been disposed on an upper surface of the wafer and that includes a plurality of film layers. The film structure includes: a lower film including at least one film layer and a groove structure; and an upper film including at least one film layer that covers an inside and an upper end of the groove structure and that is laminated above. The plasma processing method includes: removing the upper film by etching until an upper end of the groove structure of the lower film is exposed; performing etching to a film layer of the upper film inside the groove structure; and determining an end point of the performing, by using a value of thickness of the film layer inside the groove structure of the lower film upon completion of the removing.

The above object is achieved by the following plasma processing apparatus. The plasma processing apparatus is configured to perform etching to a film to be processed of a film structure that has been previously disposed on an upper surface of a wafer and that includes a plurality of film layers, by using plasma formed above the wafer to be processed disposed in a processing chamber disposed inside a vacuum chamber. The film structure includes: a lower film including at least one film layer and a groove structure; and an upper film including at least one film layer that covers an inside and an upper end of the groove structure and that is laminated above. The plasma processing apparatus includes: a detector configured to detect exposure of the upper end of the groove structure due to a first etching that performs etching to the upper film above the groove structure; and a determining device configured to determine an end point of a second etching that performs etching the film layer inside the groove structure after the exposure of the upper end of the groove structure, by using a value of depth of the film layer inside the groove structure upon detection of the exposure of the upper end of the groove structure.

An end point is determined by capturing a variation of light emission intensity of a specified wavelength in plasma light emission due to exposure of an upper end surface of the trench. In addition, remaining film thickness of a film to be processed is calculated so that trench height from the upper end surface of the trench to the base of the trench can be calculated with high precision. The trench height is used as initial film thickness. The remaining film thickness of a film to be processed that has been laminated inside the trench is subtracted from the trench height. Therefore, trench depth from the upper end surface of the trench to a surface to be processed of the film layer that has been laminated in the trench, can be detected with high precision.

DESCRIPTION OF THE PREFERRED EMBODIMENTS

An embodiment of the present invention will be described below using the drawings.

First Embodiment

The embodiment of the present invention will be described using FIGS. 1 to 4.

Figure 1:
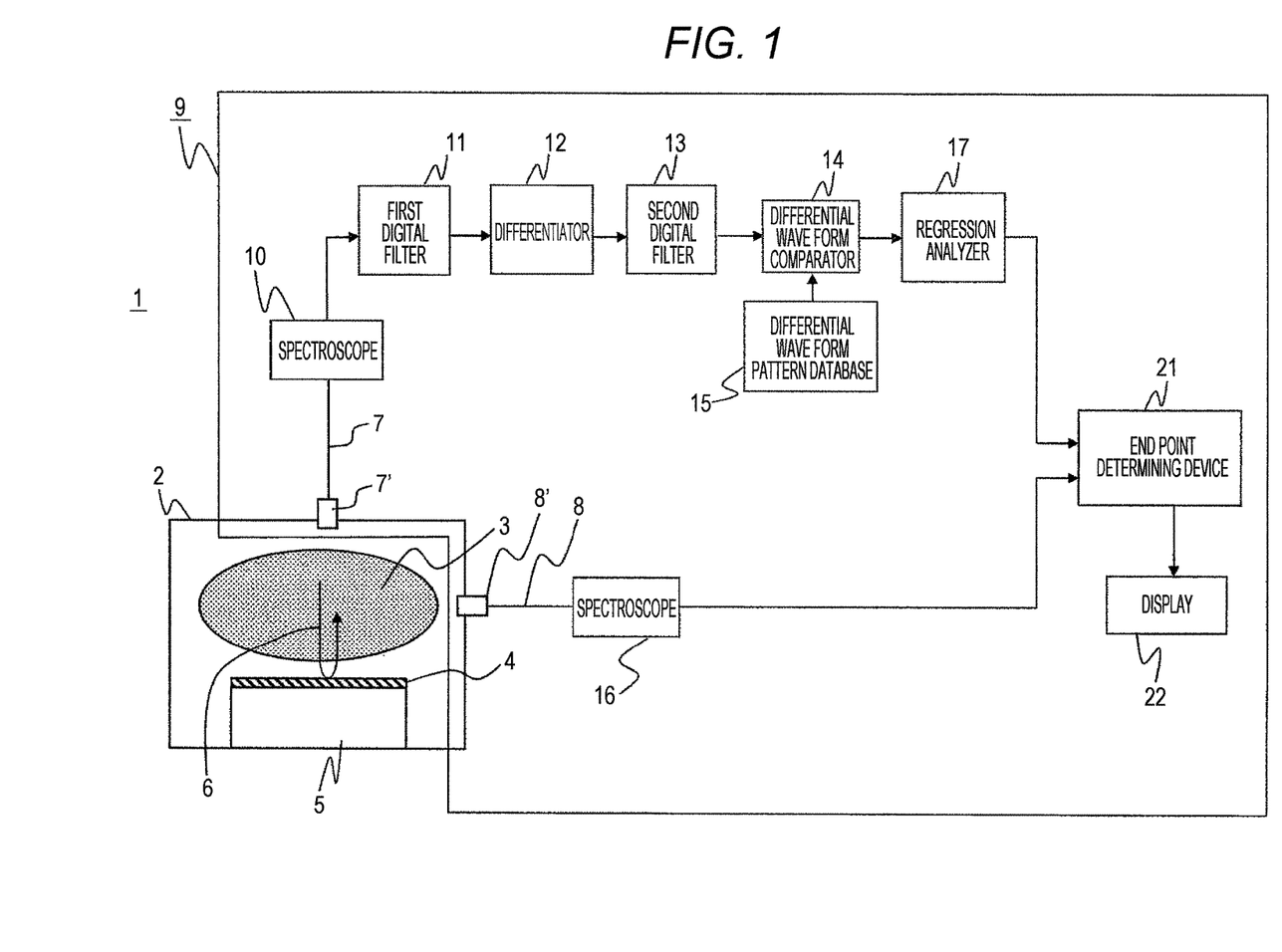
FIG. 1 is a longitudinal sectional view schematically illustrating a summary of a configuration of a plasma processing apparatus according to an embodiment of the present invention.

FIG. 1 is a longitudinal sectional view illustrating a summary of a configuration of a plasma processing apparatus according to the embodiment of the present invention.

The plasma processing apparatus 1 according to the present embodiment includes a vacuum chamber and a vacuum processing chamber 2 disposed inside the vacuum chamber. Space in the vacuum processing chamber 2 is a chamber in which etching gas is induced by, for example, a high frequency power source not illustrated so that plasma 3 is formed, the etching gas being introduced from a gas introducing unit not illustrated to the inside of the vacuum processing chamber 2.

A cylindrical sample stage 5 is disposed below the space in which the plasma 3 is formed, at the center in the vacuum processing chamber 2 having a cylindrical shape. A conveying apparatus not illustrated, such as a robot arm, outside the vacuum chamber conveys a semiconductor wafer 4 to the inside of the vacuum processing chamber 2, the semiconductor wafer 4 being a sample on a substrate. Then, the semiconductor wafer 4 is received by the sample stage 5 and is placed on a dielectric film included in an upper surface of the sample stage 5. The wafer 4 placed on the sample stage 5 is adhered and supported on the dielectric film by electrostatic force formed by direct current power supplied by a plurality of film type electrodes disposed inside the dielectric film. In the state, the above plasma 3 is formed in the vacuum processing chamber 2.

Bias potential is formed above the wafer 4 by a high frequency power supplied to a metal electrode inside the sample stage 5. Charged particles, such as ions, inside the plasma 3 are attracted onto an upper surface of the wafer 4 in accordance with a potential difference between the bias potential and the plasma 3. Due to interaction with activated species in the plasma 3, etching processing is performed to a film layer to be processed of a film structure including a plurality of film layers previously formed in the wafer 4 The above plasma 3 emits light due to degradation of an energy level of an atom or a molecule in each of gas for processing included in the plasma 3 and a reaction product formed during processing.

According to the present embodiment, photodetectors 7' and 8' receive directly the above light emission of the plasma 3 in the vacuum processing chamber 2, or light emission of the plasma 3 reflected on the above film structure on a surface of the wafer 4. The photodetectors 7' and 8' have window members including a material having translucency, such as quartz. The window members are disposed at an upper portion of a vacuum chamber above the vacuum processing chamber 2, and on a side wall of the cylindrical vacuum chamber surrounding the vacuum processing chamber 2. Pieces of light having been received are introduced into spectroscopes 10 and 16 through optical fibers 7 and 8 coupled to the photodetectors 7' and 8', respectively. Then, the pieces of light are dispersed. After that, intensity of each of the pieces of light including a plurality of wavelengths is converted into a digital signal. A film thickness measuring device 9 includes the optical fibers 7 and 8, the photodetectors 7' and 8', and the spectroscopes 10 and 16.

The film thickness measuring device 9 according to the present embodiment is coupled to the vacuum chamber. The film thickness measuring device 9 includes the optical fibers 7 and 8, the spectroscopes 10 and 16, a first digital filter 11, differentiator 12, a second digital filter 13, a differential wave form comparator 14, a differential wave form pattern database 15, a regression analyzer 17, an endpoint determining device 21, and a display 22. These are coupled by a communicating unit regardless of wired communication or wireless communication so as to be communicable. Note that, a functional configuration of the film thickness measuring device 9 is illustrated in the figure. Except the optical fibers 7 and 8, the spectroscopes 10 and 16, and the display 22, an actual configuration of the film thickness measuring device 9 can include a CPU, a storage device, a data input/output device, and communication control device. The storage device includes a ROM, a RAM, and an external storage device. The ROM stores various data, such as an etching depth measurement processing program and the differential wave form pattern database 15 of interference light. The RAM stores measurement data.

An aspect of detection of film thickness according to the present embodiment will be described below. During etching processing to a film layer to be processed of a film structure including a plurality of film layers laminated on an upper surface of the film structure, light that is reflected on the film structure and received by the photodetector 7' is caused by the following interference. Light reflected on an upper surface of the film layer to be processed and light reflected on the base of the film layer or an interface with a lower film layer, are superimposed. Two pieces of path length of the two pieces of light received through these two optical paths, are different from each other. Therefore, the two pieces of light are interfered. In the above interference light, at least one of the two pieces of path length varies in accordance with a change of thickness of the film layer to be processed, the thickness of the film layer to be processed varying as time passes during the processing. Therefore, intensity of the interference light repeatedly increases and decreases as time passes.

According to the present embodiment, the interference light that has been detected by the photodetector 7' and introduced into the spectroscope 10, from the vacuum processing chamber 2, is divided into pieces of light with a plurality of predetermined wavelengths, the interference light being reflected on the surface of the wafer 4. A current detecting signal corresponding to intensity of each of the pieces of light with the plurality of predetermined wavelengths, is converted into a voltage signal. In the above interference light including the plurality of specified wavelengths (for example, j wavelengths), the intensity of each of the pieces of light with the plurality of specified wavelengths is detected every predetermined period of time (sampling time). A signal that has been detected as a result, is received and stored in a storage device not illustrated, such as a RAM, disposed in the film thickness measuring device 9 as time series data yi, j including data arranged, the data indicating the intensity at time when the intensity has been detected or every sampling timing number i.

The time series data yi, j including, at time i, the intensity of each of the pieces of light in the interference light including the plurality of wavelengths, detected by the spectroscope 10, is transmitted to the first digital filter 11. Smoothing processing is performed to a value in the time series data yi, j at respective time inside the first digital filter 11. As a result, the time series data yi, j is detected as smoothing time series data Yi, j. The storage device, such as a RAM, not illustrated in the film thickness measuring device 9 receives the smoothing time series data Yi, j.

The smoothing time series data Yi, j is transmitted to a differentiator 12. A technique that has been used in the related art, such as a Savitzky-Golay method (S-G method), calculates a differential coefficient value (first order differential value or second order differential value) that is a rate of change at time of a value every time the smoothing time series data Yi, j is transmitted. Then, time series data di, j of the differential coefficient value is detected. A storage device, such as a RAM, not illustrated, receives the time series data di, j that has been acquired.

The time series data di, j of the differential coefficient value is transmitted to a second digital filter 13. Smoothing processing is performed to the time series data di, j. Then, smoothing differential coefficient time series data Di, j is calculated. A storage device, such as a RAM, not illustrated receives the smoothing differential coefficient time series data Di, j. The smoothing differential coefficient time series data Di, j is used so as to acquire an actual pattern indicating wavelength dependency of a differential value of the interference light intensity (wavelength j as a parameter).

Next, calculation of the smoothing differential coefficient time series data Di of an arbitrary wavelength out of j wavelengths, will be described. According to the present embodiment, a second order Butterworth low pass filter is used as the first digital filter 11. In the second order Butterworth low pass filter, smoothing time series data Yi regarding the arbitrary wavelength is acquired by Expression (1).

$$Yi = b1 \cdot i + b2 \cdot i - 1 + b3 \cdot i - 2 - [a2 \cdot i - 1 + a3 \cdot i - 2] \quad (1)$$

Values of coefficients a and b depend on a sampling frequency and a cut-off frequency. Coefficient values of the digital filter include, for example, a2=−1.143, a3=0.4128, b1=0.067455, b2=−0.013491, and b3=0.067455 (sampling frequency of 10 Hz, cut-off frequency of 1 Hz).

According to the present embodiment, the time series data di of the second order differential coefficient value of the smoothing time series data Yi is calculated by the following Expression (2) using a polynomial fitting smoothing differential method including five pieces of time series data Yi in the differentiator 12.

$$di = \sum_{j=-2}^{j=2} wj \cdot Yi + j \quad (2)$$

Weight coefficients w according to the present embodiment are set so as to satisfy w−2=2, w−1=−1, w0=−2, w1=−1, w2=2.

The second digital filter 13 calculates the smoothing differential coefficient time series data Di from the time series data di of the differential coefficient value acquired as described above. For example, a low pass filter including a second order Butterworth circuit is used for the second digital filter 13 according to the present embodiment. Di is calculated by the following Expression (3).

$$Di = b1 \cdot i + b2 \cdot i - 1 + b3 \cdot i - 2 - [a2 \cdot i - 1 + a3 \cdot i - 2] \quad (3)$$

The differential wave form pattern database 15 of the film thickness measuring device 9 according to the present embodiment, stores, as database, data of a pattern in which film thickness at each time corresponds to a pattern of differential wave form of intensity of light emission at each of the plurality of wavelengths, the pattern being acquired every time during the processing, when etching processing is performed to a film structure that is substantially the same as or is approximated so as to be similar to a film structure previously formed on another wafer, with a condition that is substantially the same as or is approximated so as to be similar to a condition of processing to the wafer 4 to be processed (for example, a type and a composition of gas for processing, pressure inside the vacuum processing chamber 2, intensity and distribution of an electric field or a magnetic field for forming the plasma 3, and a period of time during which processing is performed in a processing process). Note that, a storage device, such as a RAM, not illustrated, stores the differential wave form pattern database 15.

The differential wave form comparator 14 compares data of a differential wave form pattern stored in the above differential wave form pattern database 15 and the smoothing differential coefficient time series data Di, j received from the second digital filter 13 at arbitrary time i. The differential wave form comparator 14 calculates a pattern, in the data that has been stored, determined to be most similar to actual differential wave form pattern including j wavelengths as a parameter at the arbitrary time i at which the film thickness should be acquired. Film thickness corresponding to the pattern determined to be the most similar, is detected as an instantaneous film thickness value Zi at time i. In data comparison in the differential wave form comparator 14 according to the present embodiment, a root mean square value σ2 of deviation of each of pieces of data according to the above two patterns, is calculated. A calculator, such as a semiconductor microprocessor, included in the film thickness measuring device 9, determines that a differential wave form pattern stored in the differential wave form pattern database 15 is most similar to the actual differential wave form pattern, the differential wave form pattern with which the root mean square of the deviation is minimum.

The instantaneous film thickness value Zi at time i calculated by the differential wave form comparator 14, is transmitted to the regression analyzer 17. The instantaneous film thickness value Zi is used together with data of an instantaneous film thickness at each of a plurality of pieces of time before time i. A current film thickness value is calculated by calculation based on a predetermined algorithm in the regression analyzer 17. According to the present embodiment, the film thickness value at time i is calculated by using a regression line approximation method using the instantaneous film thickness value Zi at time i and instantaneous film thickness values at a plurality of pieces of time before time i. That is, the regression analyzer 17 acquires a first order regression line $Y=Xa \cdot t+Xb$ (Y: a remaining film amount, t: etching time, Xa: the absolute value of Xa is an etching rate, Xb: initial film thickness). The film thickness value (calculated film thickness) at time i is calculated by the expression of the regression line. With the calculated film thickness value and data of an initial thickness value the film layer to be processed, a configuration in which an etching depth value is calculated by subtracting the calculated film thickness value from the initial thickness value, may be made.

The calculated film thickness value or the etching depth value calculated by the regression analyzer 17 is transmitted to the end point determining device 21. Then, in the end point determining device 21, the calculated film thickness value or the etching depth value are compared to a film thickness value or an etching depth value previously stored in, for example, a RAM, respectively, the film thickness value or the etching depth value being a target. In a case where the target is determined to be reached or exceeded, the film thickness measuring device 9 determines that an end point of the etching processing has been reached. When it is determined whether the end point of the processing has been reached, a result of the determination is transmitted from the end point determining device 21 to the display 22 including, for example, liquid crystal or a CRT. Then, the result is displayed. A user of the apparatus 1 is notified of the result.

Figure 2A:
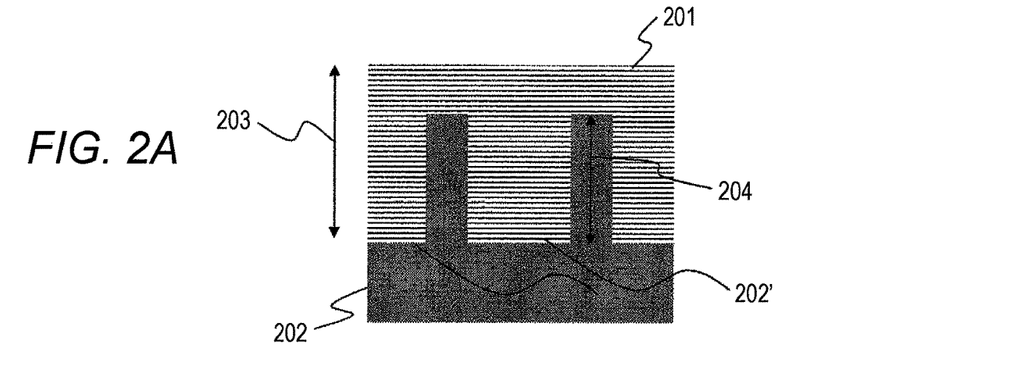
FIGS. 2A to 2C are cross-sectional views each schematically illustrating a configuration of a film structure to be an object to which processing is performed by the plasma processing apparatus according to the embodiment illustrated in FIG. 1.
Figure 2B:
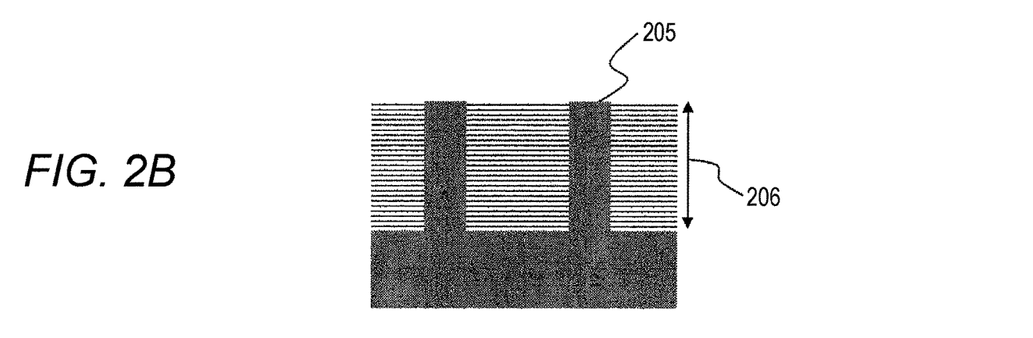
Figure 2C:
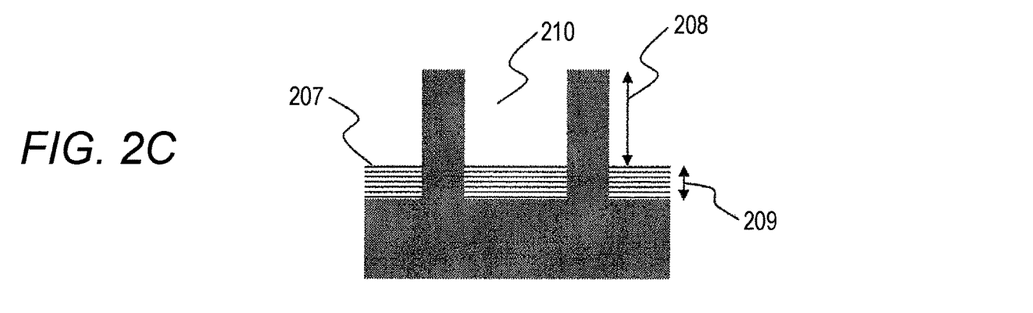

A configuration of the film structure to be an object to which the apparatus 1 according to the present embodiment performs the etching processing, will be described using FIGS. 2A, 2B, and 2C. FIGS. 2A to 2C are exemplary cross-sectional views schematically illustrating the configuration of the film structure to be an object to which the apparatus 1 according to the present embodiment illustrated in FIG. 1 performs the processing.

The film structure to be an object according to the present embodiment, previously formed on the upper surface of the wafer 4, includes a film layer disposed on the lower side and a film layer that is disposed on the upper side of the film layer and covers the film layer. In particular, the film layer disposed on the lower side includes at least one groove shape (trench). The inside of the groove shape is buried by and filled with the film layer disposed on the upper side.

According to the present embodiment, the lower film layer 202 including the groove shape formed includes a material that reflects light, for example, silicon (Si). The upper film layer 201 is disposed inside the groove of the film layer 202 and on a portion above an upper end of a portion including a side wall of the groove. The upper film layer 201 includes a material, such as SiO2, polysilicon (Poly-Si), or SiN.

By a technique in the related art, for example, chemical vapor deposition (CVD), the inside of the groove of the film layer 202 is buried by and filled with the material included in the upper film layer 201. Furthermore, the material is laminated by height above an upper end surface of the groove (side wall) so that the upper film layer 201 is formed.

FIG. 2A is a longitudinal cross-sectional view schematically illustrating the configuration of the film structure in an initial state before the etching processing is started. In the present figure, the lower film layer 202 includes the groove 202' having the side wall portion with the height 204 formed thereon. The lower film layer 202 includes the height 204 as the depth of the groove 202'.

Furthermore, after the inside of the groove 202' is buried by and filled with the upper film layer 201, the upper film layer 201 is further laminated so that an upper surface of the upper film layer 201 is positioned at a height position above the side wall of the groove 202'. In the initial state in the present figure, the upper film layer 201 of the film structure includes film thickness 203 between the upper surface of the upper film layer 201 and the base of the groove of the lower film layer 202.

FIG. 2B is a longitudinal cross-sectional view schematically illustrating the configuration of the film structure in a state where a first step of the etching processing has been completed with respect to the film structure. The first step is a process in which etching is performed to the upper film layer 201. The first step performs the etching from the upper surface of the upper film layer 201 until the upper end surface of the side wall of the groove 202' of the lower film layer 202 is exposed.

That is, in a case where the etching of the first step has been completed, the portion that is an upper portion of the upper film layer 201, above the upper end of the groove 202' of the film layer 202, is removed. Then, the upper end surface of the side wall of the groove 202' is exposed to the vacuum processing chamber 2 above. In the above state, film thickness 206 of the upper film layer 201 that is a distance between the upper surface and the base of the groove 202' inside the groove 202', is substantially the same as the height 204 of the groove 202' or a value approximated so as to be similar to the height 204.

FIG. 2C is a longitudinal cross-sectional view schematically illustrating the configuration of the film structure in a state where a second step of the etching processing has been completed, the second step being performed to the film structure by the apparatus 1 according to the present embodiment. The second step is a process in which etching is performed to the upper film layer 201 like the first step. The etching is performed to the film layer 201 inside the groove 202' of the lower film layer 202. A new groove (trench) 210 interposed between side walls of the groove 202' of the film layer 202, is formed inside of the groove 202' of the film layer 202 so as to have a depth 208 of a predetermined value, the new groove 210 including the upper surface of the film layer 201 as the base inside the side walls of the groove 202'.

That is, the second step performs the etching to the film layer 201 inside the groove 202' of the film layer 202. Then, the film layer 201 inside the groove 202' of the film layer 202 is removed and side wall surfaces of the wall portions of the groove 202' of the film layer 202 are exposed. The trench 210 that is surrounded by the upper surface of the film layer 201 and the side wall portions of the film layer 202 that have been exposed, is formed, the trench 210 being a new groove. Note that, in the second step according to the present embodiment, an endpoint is defined as a state where the film layer 201 inside the groove 202' of the film layer 202 remains with film thickness 209.

After the second step has been completed, another material is laminated inside the trench 210 so as to bury the trench 210, the material being included in wiring structure of a semiconductor device segmented and formed from the wafer 4 after other processing has been performed as necessary after the etching. Performance and a function of the above device receive an effect depending on a shape of wiring disposed inside of the above trench 210. Thus, there is a problem that a rate of defective devices outside an allowable range of the performance increases in a case where variation of the shape is excessively large between individual devices (namely, by different positions of the film structure to be a wiring structure of the device, on the wafer 4 or by individual wafers). In order to inhibit the problem, it is important to inhibit variation of a value of the depth 208 of the wafer 4 in the above etching processes and to achieve the etching with high precision.

Note that, in the film structure of the present example, a configuration in which one film layer is disposed on the upper side and the other film layer is disposed on the lower side, has been described. Each of the upper film layer and the lower film layer may include a plurality of different materials. For example, the groove 202' may include two film layers. The groove 202' includes the lower layer including Si to be a substrate. A film layer includes a material that has reflectivity smaller than that of Si and is different from that of the upper film layer 201. The film layer is disposed on the upper end of the side wall portion of the groove 202'. Examples of the above material include SiC, SiN, and SiO2. The film layer can serves as a mask for forming the groove 202' or the trench 210. Therefore, the film layer may be the so-called resist mask using a resin material.

There may be provided a base portion film layer and an upper portion film layer. The base portion film layer includes a different material having reflectivity higher than that of a material including the upper end surface of the side wall portion of the groove 202' of the film layer 202 or that of Si that is the substrate, the base portion film layer being disposed on an upper base portion caused by covering the base of the groove 202' of the lower film layer 202 with the upper film layer 201. The upper portion film layer is disposed inside the groove 202' of the film layer 202 and covers the upper side of the base portion film layer so as to bury the groove 202' and to be laminated. Furthermore, the upper portion film layer buries the inside of the groove 202' of the lower film layer 202 so as to be laminated by the upper end surface of the side wall portion of the groove or by height approximated similar to the upper end surface. The upper film layer 201 may further include another film layer that covers the upper end surface of the side wall portion of the groove 202' and the upper side of the upper portion film layer so as to be laminated by the height of the depth 208.

Figure 3A:
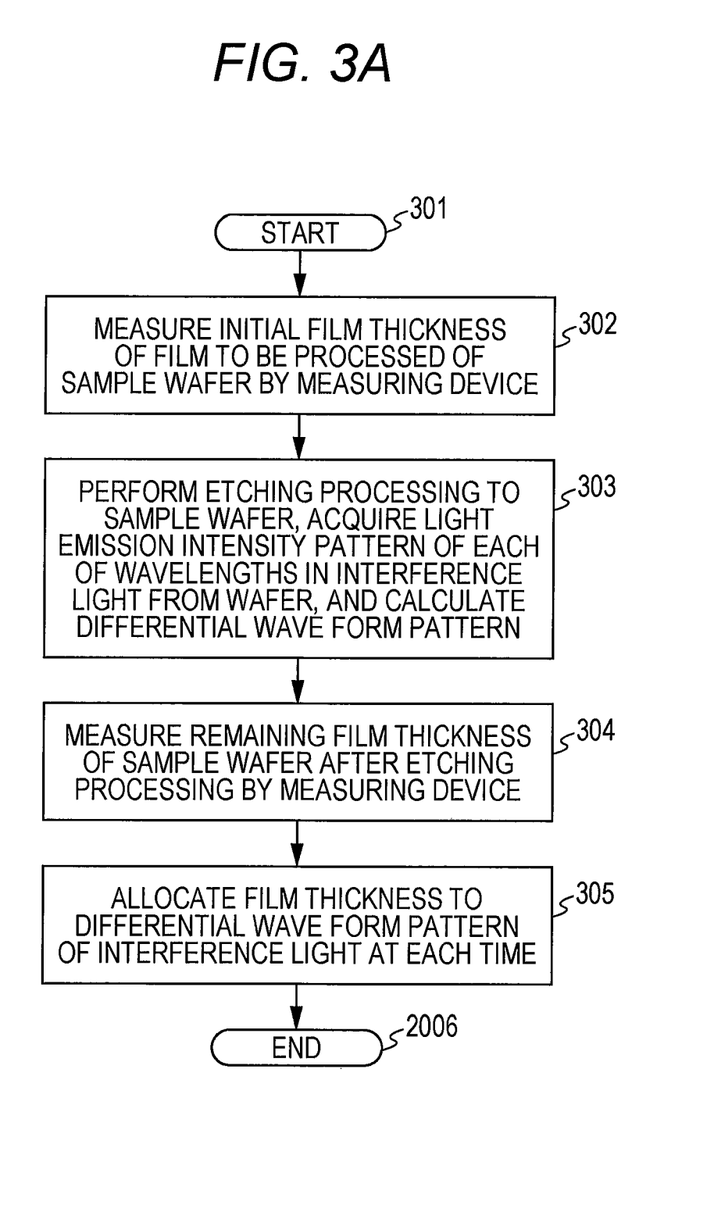
FIG. 3A is a flow chart illustrating a flow of processes for creating a differential wave form pattern database according to the embodiment illustrated in FIG. 1.
Figure 3B:
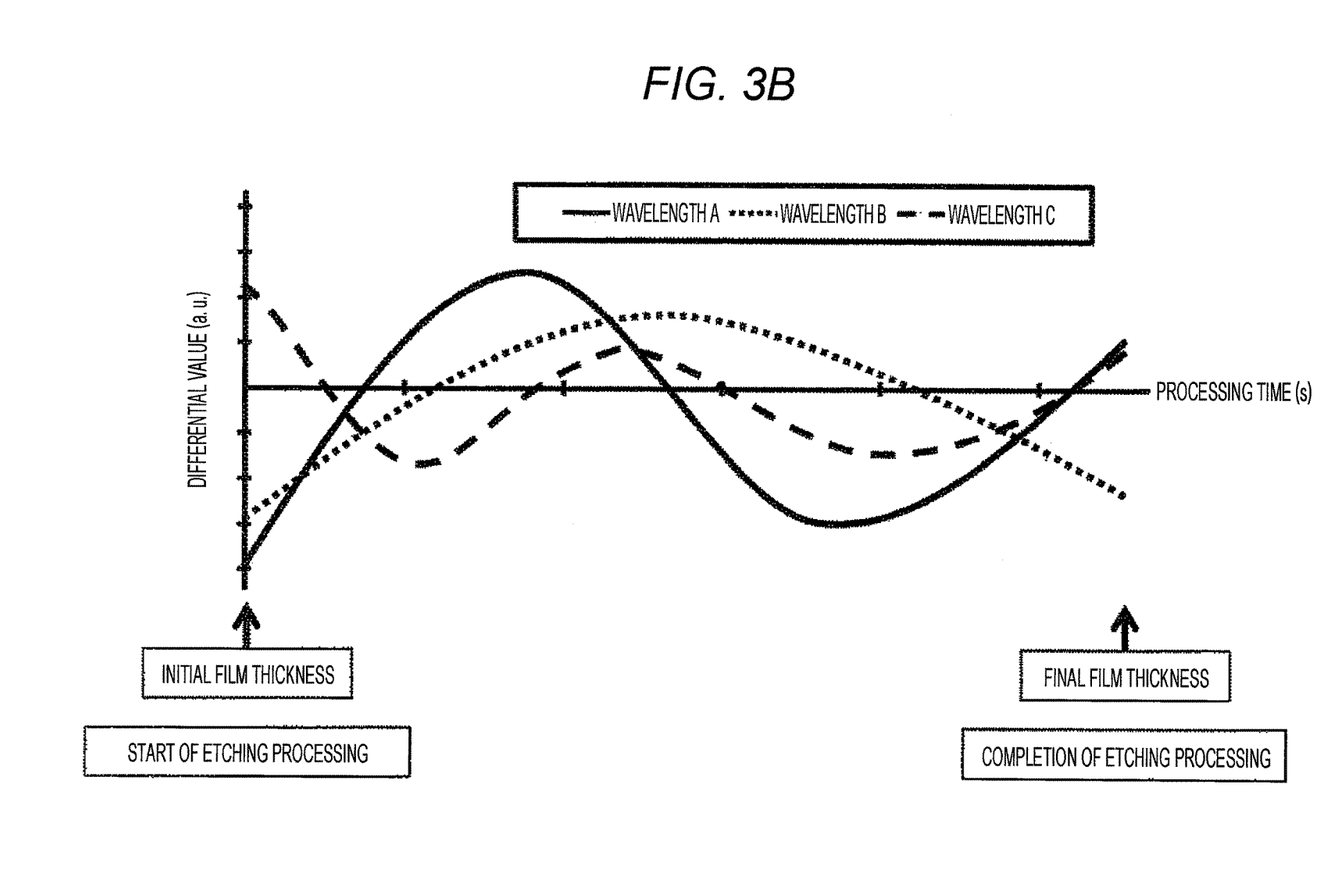
FIG. 3B is a graphical representation schematically illustrating exemplary data of the database.

Next, a process for creating the differential wave form pattern database 15 illustrated in FIG. 1, will be described using FIG. 3. FIG. 3A is a flow chart illustrating a flow of the process for creating the differential wave form pattern database according to the embodiment illustrated in FIG. 1. FIG. 3B is a graphical representation schematically illustrating exemplary data of the database.

FIG. 3A is the flow chart illustrating a summary of the flow of the process for creating the differential wave form pattern database according to the present embodiment. According to the present embodiment, after START (Step 301), as described above, before the processing of the wafer 4 for manufacturing a semiconductor device to be a product, thickness of a film layer to be processed of a sample to be measured (sample wafer), is detected, the sample to be measured previously including a film structure including a configuration that is substantially the same as the wafer 4 or is approximated so as to be similar to the wafer 4, disposed on an upper surface of the sample (Step 302).

According to the present embodiment, the film layer to be processed is the upper film layer 201. Thus, initial thickness 203 before the processing is started, is detected at Step 302. As a technique in the related art, for example, a critical dimension SEM can be used for the detection.

Next, etching processing is performed to the sample wafer. An etching processing condition is substantially the same as a processing condition of the wafer 4 or a condition approximated so as to be similar to the processing condition of the wafer 4 (for example, a type and a composition of gas for processing, pressure inside the vacuum processing chamber 2, intensity and distribution of an electric field or a magnetic field for forming the plasma 3, and a period of time during which processing is performed in each process).

A pattern of intensity of each of wavelengths included in interference light is detected so as to be stored in the storage device, the interference light being reflected on a surface of the sample wafer so as to be detected at a plurality of pieces of time at a predetermined time interval during the processing. Time series data indicates intensity of the interference light accompanied with a lapse of the plurality of pieces of time. A differential wave form of the time series data is calculated through the first digital filter 11, the differentiator 12, and the second digital filter 13 in the film thickness measuring device 9 illustrated in FIG. 1. Then, a time series smoothing differential wave form pattern is detected regarding the intensity of the interference light including wavelengths as a parameter (Step 303).

The above processing of the sample wafer is the same as processing performed to the wafer 4 for manufacturing a product device, in the apparatus 1 or approximation similar to the processing. The etching processing including the first step and the second step following the first step, is performed to the film structure illustrated in FIG. 2. The above time series differential wave form pattern is detected in each process. Note that, a time series differential wave form pattern at the first step and a time series differential wave form pattern at the second step may be individually detected in pieces of different sample wafer processing.

Next, for example, a critical dimension SEM is used so as to detect the film thickness 206 of the film layer 201 after the first step has been completed, illustrated in FIG. 2B, and film thickness 209 of the film layer 201 after the second step of the etching processing to the film layer 201 has been completed, illustrated in FIG. 2C (Step 304). These pieces of detection may be performed with respect to a sample wafer different from the sample wafer to which the processing according to Step 303 is performed.

The initial film thickness 203 of the film layer 201 is detected at Step 302. The film thickness 206 of the film layer 201 is detected at Step 304 after the first step has been completed and before the second step is started. The film thickness 209 of the film layer 201 is detected at Step 304 after the second step has been completed or the etching processing has been completed. The initial film thickness 203, the film thickness 206, and the film thickness 209 are allocated and correspond to each of pieces of time at which time series differential wave form pattern is acquired regarding the intensity of the interference light including the plurality of wavelengths. Then, time series differential wave form pattern database is calculated (Step 305).

FIG. 3B illustrates an example of the above time series differential wave form pattern. FIG. 3B is a graphical representation schematically illustrating the time series differential wave form pattern detected at Step 305 regarding the intensity of the interference light including the plurality of wavelengths.

In the present figure, the horizontal axis represents time variation including a start of the etching of the first step defined as a starting point. Curves illustrated by a solid line, a short-dashed line, and a long-dashed line represent, as a function of time, smoothed differential values of pieces of intensity of wavelengths A, B, and C in the interference light, detected during the processing of the sample wafer at Step 303. The value of the horizontal axis corresponds to time during the processing. In a case where a rate of the etching processing (rate) has a constant or a value in an allowable range approximated so as to be similar to the constant during the processing, the value of the horizontal axis corresponds to remaining film thickness or an etching-performed amount of the film layer 201, namely, the depth of the trench 210 in the present example.

As illustrated in the present figure, a combination of differential values of the plurality of wavelengths with respect to a value of time, remaining film thickness, or processed depth, is uniquely determined as a pattern including wavelengths as a parameter. At Step 306, as described above, as the differential wave form pattern database 15, the above differential wave form pattern data of the intensity of the interference light having wavelengths as a parameter, is stored and saved in the storage device not illustrated, the differential wave form pattern data corresponding to every time, the remaining film thickness of a film to be processed, or the processed depth during the etching processing.

Figure 4:
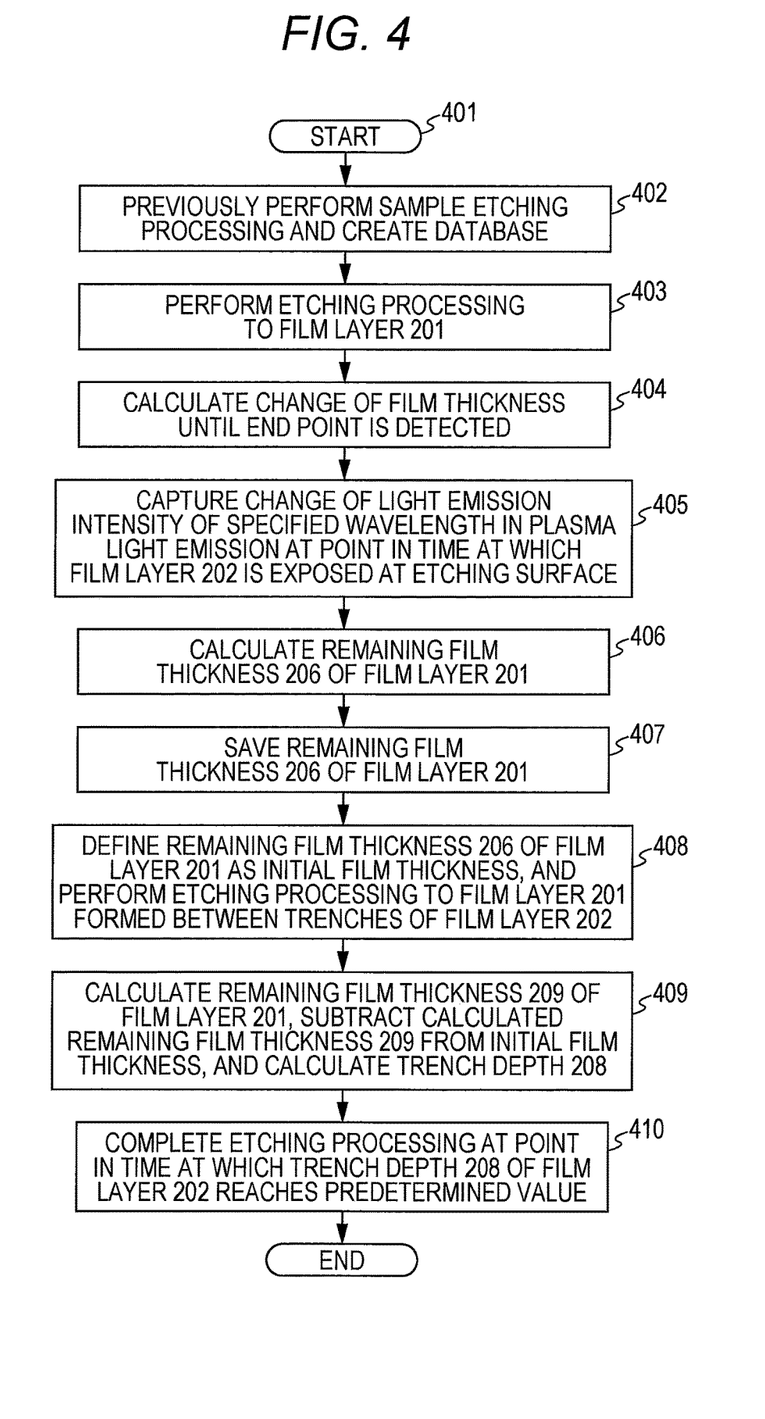
FIG. 4 is a flow chart illustrating a flow of operation with which the plasma processing apparatus according to the embodiment illustrated in FIG. 1 determines an end point of etching.

Operation for determining an end point of the etching according to the present embodiment, will be described using FIG. 4. FIG. 4 is a flow chart illustrating a flow of the operation with which the plasma processing apparatus according to the embodiment illustrated in FIG. 1 determines an end point of the etching.

After a START of the operation (Step 401), first, in order to create the data of the differential wave form pattern database 15 illustrated in FIG. 3, data of smoothed time series differential wave form pattern data acquired by performing etching processing to the sample wafer is stored in the differential wave form pattern database 15, the data including wavelengths of the interference light as a parameter. At this step, time series data of the differential wave forms regarding the pieces of intensity of the plurality of wavelengths in the interference light during the processing of the sample wafer, is detected. In addition, the thickness of the film to be processed of the film structure is detected before the start of the etching processing, during the processing, and after the processing. The thickness and the time series data are made to correspond to each other so that database is created (Step 402).

Next, the wafer 4 to be a product and to be an object for manufacturing a semiconductor device is disposed and supported on the sample stage 5 inside the vacuum processing chamber 2. Then, the plasma 3 is formed inside the vacuum processing chamber 2. The high frequency power source applies high frequency power to the electrode in the sample stage 5. Then, the etching is performed to the upper film layer 201 of the film structure on the upper surface of the wafer 4 (Step 403). The first step of the etching is performed until the upper end surface of the side wall portion of the groove 202' of the lower film layer 202 is exposed illustrated in FIG. 2B from the initial state of the film layer 201 illustrated in FIG. 2A.

According to the present embodiment, until the upper end surface of the side wall portion of the groove 202' of the film layer 202 is disposed at the first step, in the film thickness measuring device 9 illustrated in FIG. 1, the film thickness is detected by using the interference light from the film structure on the upper surface of the wafer 4, the interference light being detected through the photodetector 7' disposed on the upper side of the vacuum processing chamber 2, a detecting surface of the photodetector 7' being disposed facing the upper surface of the wafer 4. In addition, a characteristic time variation is detected regarding intensity of light with a specified wavelength of light emission of the plasma 3 detected through the photodetector 8' disposed on the side wall of the vacuum chamber and disposed on the side of the vacuum processing chamber 2 facing the plasma 3 (Step 404). From data of a signal that indicates the intensity of the light emission of the plasma 3 including the specified wavelength dispersed and acquired by a spectroscope 16, a time variation is detected regarding the intensity of the light emission of the plasma 3 with the specified wavelength caused by a reaction product occurring upon the exposure of the upper end surface of the side wall portion of the film layer 202.

The above characteristic time variation of the light emission of the plasma 3 received by the photodetector 8' and transmitted to the spectroscope 16, may be detected by using a smoothed differential coefficient calculated by using the first digital filter 11, the differentiator 12, and the second digital filter 13 illustrated in FIG. 1. For example, when the upper end surface of the side wall member of the lower film layer 202 is exposed to the plasma 3 inside the vacuum processing chamber 2, particles including, as a component, Si that is a material included in the side wall member, separate into the plasma 3. Thus, the intensity of light with a wavelength corresponding to the light emission of the particles, increases. As a result, the time variation of the intensity of the light emission or the differential value occur.

The characteristic time variation of the intensity of the light emission is transmitted to the end point determining device 21. Then, it is determined whether the first step reaches the end point by using the above time variation of the intensity detected by the endpoint determining device 21 (Step 405). Note that, the detection of the end point is performed by using the plasma light emission that has been incident on the spectroscope 16. The plasma light emission that has been incident on the spectroscope 10, may be used.

When the end point of the first step has been determined, the remaining film thickness 206 of the film layer 201 is calculated with the interference light, from the wafer 4, detected through the photodetector 7' in the film thickness measuring device 9 (Step 406). As a value of the height 204 of the groove 202' of the film layer 202, a value of the film thickness 206 of the film layer 201 that has been calculated is stored in the storage device not illustrated in the film thickness measuring device 9 (Step 407). After that, the film thickness 206 of the film layer 201 is used as initial film thickness of the film layer 201 to be processed in the second step. The second step that performs etching processing to the film layer 201, is started (Step 408).

As calculated film thickness, the remaining film thickness 209 of the film layer 201 is calculated by using the interference light from the film structure on the upper surface of the wafer 4 through the photodetector 7' at a predetermined time interval during the second step. The depth 208 of the trench 210 is calculated by subtracting the calculated film thickness or the remaining film thickness 209 from the value of the height 204 or the film thickness 206 of the film layer 202 saved at Step 407 (Step 409). In the end point determining device 21, the value of the depth 208 is compared to a target value previously stored in the storage device. Then, it is determined whether the second step or the etching processing reaches the end point. When reaching the end point, the second step or the etching processing is completed (Step 410).

As described in the above embodiment, the depth of the trench 210 or the remaining film thickness is calculated with high precision by using the remaining film thickness detected after the first step is completed and the film thickness detected during the second step. The film thickness is measured from the initial state illustrated in FIG. 2A. Timing at which the shape illustrated in FIG. 2B is made, namely, the characteristic time variation of the intensity of light emission of the specified wavelength in the light emission of the plasma 3 due to the exposure of the upper end surface of the groove 202' of the film layer 202, is captured. Therefore, the determination of the endpoint of the first step is performed so that the height 204 of the trench 210 is detected with high precision.

According to the above embodiment, even in a case where the height 204 of the groove 202' of the lower film layer 202 or the film thickness 206 greatly varies every wafer 4, the depth 208 of the trench 210 can be calculated with high precision. At a point in time at which the desired depth 208 of the trench 210 is made, the etching processing can be completed. Accuracy of the shape after the processing can be improved. Accordingly, a yield of the processing can be improved.

What is claimed is:

1. A plasma processing method comprising:
    disposing a wafer to be processed in a processing chamber inside a vacuum chamber;
    forming plasma in the processing chamber; and
    performing etching to a film to be processed of a film structure that has previously been disposed on the upper surface of the wafer and that includes a plurality of film layers,
    wherein the film structure includes:
        a lower film including at least one film layer and a groove structure; and
        an upper film including at least one film layer that covers an inside and an upper end of the groove structure and that is laminated above,
    the plasma processing method comprising:
    removing the upper film by etching until an upper end of the groove structure of the lower film is exposed;
    performing etching to a film layer of the upper film inside the groove structure; and
    determining an end point of the performing, by using a value of thickness of the film layer inside the groove structure of the lower film upon completion of the removing.

2. The plasma processing method according to claim 1, comprising the determining the end point of the performing by using a value of remaining film thickness of the film layer of the upper film inside the groove structure, the value being detected by using pieces of intensity of a plurality of wavelengths in interference light acquired by the film structure during the performing.

3. The plasma processing method according to claim 1, wherein the film layer of the upper film inside the groove structure includes substantially the same material as the film layer above the upper end of the groove structure.

4. The plasma processing method according to claim 1, further comprising determining an end point of the removing based on a variation of light emission of the plasma due to the exposure of the upper end of the groove structure of the lower film.

5. The plasma processing method according to claim 1, wherein, in the film structure, reflectivity of the film layer inside the groove structure is higher than reflectivity of the film layer included in the upper end of the groove structure.

* * * * *